United States Patent [19]
Amago et al.

[11] Patent Number: 5,402,314
[45] Date of Patent: Mar. 28, 1995

[54] PRINTED CIRCUIT BOARD HAVING THROUGH-HOLE STOPPED WITH PHOTO-CURABLE SOLDER RESIST

[75] Inventors: Hirohisa Amago; Seimi Ishii; Nobuo Komatsu; Nobuyuki Yasuda, all of Kanagawa, Japan

[73] Assignee: Sony Corporation, Japan

[21] Appl. No.: 12,926

[22] Filed: Feb. 3, 1993

[30] Foreign Application Priority Data

Feb. 10, 1992 [JP] Japan .................................. 4-024156

[51] Int. Cl.⁶ .............................................. H05K 7/02
[52] U.S. Cl. ................................. 361/760; 361/761; 174/260; 174/262; 174/263; 174/266
[58] Field of Search ............... 361/760, 761, 807–812, 361/762–764, 766–768; 174/260–267; 29/832, 846; 228/180.1, 180.21, 180.22

[56] References Cited

U.S. PATENT DOCUMENTS

4,230,793 10/1980 Losert et al. .................... 430/315
4,884,337 12/1989 Choinski ............................ 29/846

FOREIGN PATENT DOCUMENTS

0145891 6/1989 Japan .......................... 228/180.1

*Primary Examiner*—Bot Ledynh
*Attorney, Agent, or Firm*—Ronald P. Kananen

[57] ABSTRACT

A printed circuit board having a through-hole in a land is disclosed. A solder resist of a photo-curable solder resist is formed on the substrate surface of the printed circuit board and the through-hole is stopped with the same photo-curable solder resist as the solder resist layer. If a land on which a chip component is mounted co-exists with a land on which a discrete component is mounted, only the through-hole in the land on which the chip component is mounted is selectively stopped with the photo-curable solder resist. The solder resist layer and the photo-curable solder resist stopping the through-hole are formed by selective light exposure from both the front and reverse surfaces of the substrate.

5 Claims, 4 Drawing Sheets

PRINTED CIRCUIT BOARD HAVING THROUGH-HOLE STOPPED WITH PHOTO-CURABLE SOLDER RESIST

BACKGROUND OF THE INVENTION

1. Field of the Invention

This invention relates to a printed circuit board having through-holes, and a method for producing the same.

2. Description of the Background

In the field of printed circuit boards, there is a tendency towards high density packaging for coping with miniaturization of electronic devices, and a so-called double-side printed circuit board is employed extensively, as shown in FIG. 10.

With the double-sided printed circuit board, a desired metallization pattern is provided on each of the substrate surfaces, and a through-hole 101 is formed through the substrate 102 at an optional position of the substrate.

Meanwhile, with the printed circuit board, chip components, such as chip resistances or chip capacitors, as packaging components, are mounted on a land 103 by soldering, such as by cream soldering. It is a frequent occurrence that molten solder flows into the through-hole 101 from land 103 during soldering where it is inadvertently contacted with the interconnection pattern on the back side to establish electrical connection to interfere with a normal operation.

A conventional practice for avoiding such problem has been to provide a small spacing between the through-hole 101 and the land 103a and to establish electrical connection by providing a connecting pattern 103a.

However, if the through-hole 101 is spaced apart from the land 103, the space on the substrate 102 occupied by these components is increased to retrogress from high density packaging of the printed circuit board.

For coping with such problem, a printed circuit board as shown in FIGS. 11 and 12 has been proposed.

The printed circuit board, shown in FIG. 11, is provided with a through-hole 105 in a land 106 which is reduced in size. Besides, as shown in FIG. 12, a solder resist 107 is provided on the back side of the substrate 102 for stopping the through-hole 105.

In such case, should the solder flow into the through-hole 105 during soldering a chip component 104 to the land 106, it cannot occur that the solder be allowed to flow onto the back side of the substrate.

However, since the solder resist 107 is provided on the back side of the substrate 102, it becomes impossible to mount chip components on the back side of the substrate, as a result of which the number of the components that can be mounted is decreased to retrogress from high density packaging of the printed circuit board.

SUMMARY OF THE INVENTION

It is therefore an object of the present invention to provide a printed circuit board which permits of high density packaging and which is highly reliable with the least risk of inadvertent short-circuiting due to solder flow-out, and a method for producing such printed circuit board.

It is another object of the present invention to provide a printed circuit board which can cope with a case in which not only the chip components but also discrete components which need to be soldered by leads introduced in the through-holes are present on the substrate and which can be used for wide usage and application.

In accordance with the present invention, there is provided a printed circuit board having a through-hole in a land region, wherein a solder resist layer of a photo-curable solder resist is formed in accordance with an interconnection pat tern on the surface of the printed circuit board, and wherein at least a mid part of the through-hole is stopped with a photo-curable solder resist which is of the same material as that of the solder resist layer.

In another aspect of the present invention, a mid part of the through-hole provided in a land region on which a chip component is mounted is stopped with the photo-curable solder resist and wherein the through-hole provided in a land on which a discrete component is mounted is opened, that is not stopped.

In accordance with the present invention, there is also provided a method for producing a printed circuit board comprising the steps of applying the liquid photo-curable solder resist on one surface of a printed circuit board having a through-hole in a land region for charging the photo-curable solder resist in said through-hole, forming a solder resist layer in said through-hole on said one surface in accordance with an interconnection pat tern by selective light exposure from said one surface, and curing said photo-curable solder resist in said through-hole by selective light exposure from the other surface of said substrate through a mask having a light-transmitting region in register with said through-hole.

The lead part of a chip component as a component mounted on the printed circuit board is soldered to the land. The through-hole passing through the substrate is stopped halfway with a photo-curable solder resist which is formed simultaneously with the solder resist layer. Consequently, if the solder is allowed to flow into the through-hole during soldering of the lead part of the chip component to the land of the printed circuit board, it is blocked by the photo-curable solder resist without being allowed to flow to the reverse substrate surface.

On the other hand, if the through-holes are stopped in their entirety with the photo-curable solder resist, the leads for discrete component which occasionally co-exist with the chip components parts cannot be introduced in position in the through-holes. According to the present invention, it becomes possible to stop only the through-holes provided in the lands on which the chip components are mounted while keeping the remaining through-holes open so that no hindrance is incurred when mounting the discrete components.

With the method for producing the printed circuit board according to the present invention, the solder resist layer and the photo-curable solder resist stopping the through-hole are formed of the same material and are produced by the same process so that there is substantially no necessity of changing the process steps from the process steps of producing the usual solder resist layer and hence an increase in the process step is insignificant.

FIG .7 is a schematic cross-sectional view showing the step of developing the photo-curable solder resist layer.

Figure 8:
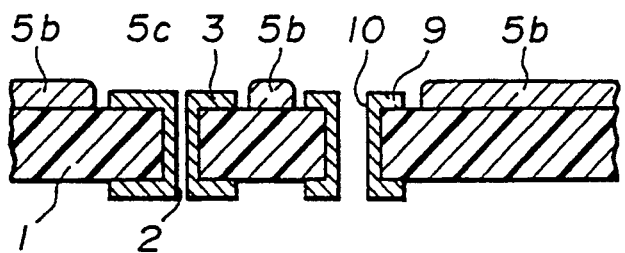

FIG. 8 is a schematic plan view showing another embodiment of a printed circuit board according to the present invention.

Figure 9:
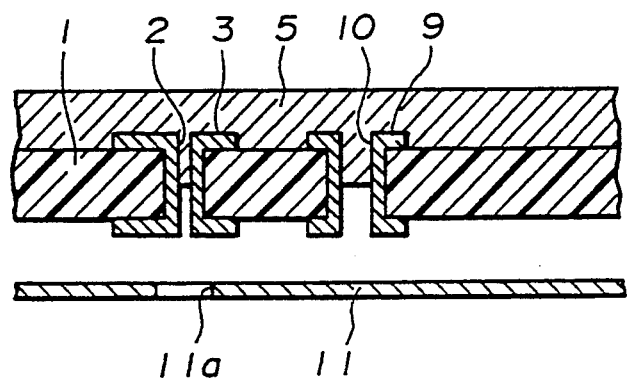

FIG. 9 i s a schematic cross-sectional view showing another example of the step of a selective light exposure for the solder resist within the through-hole.

Figure 10:
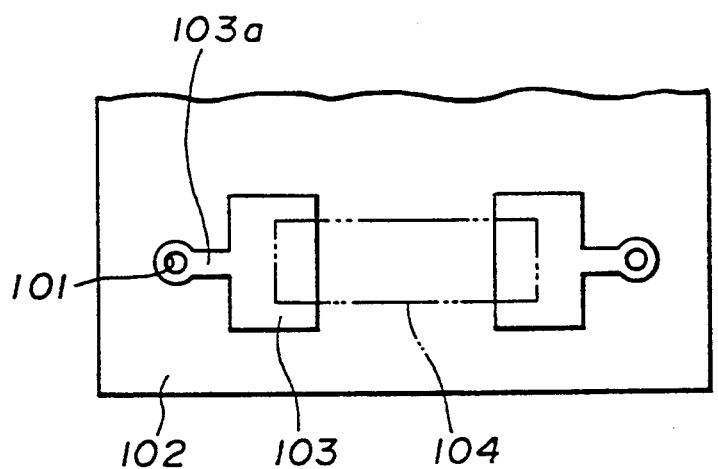

FIG. 10 i s a schematic plan view showing an example of a conventional printed circuit board.

Figure 11:
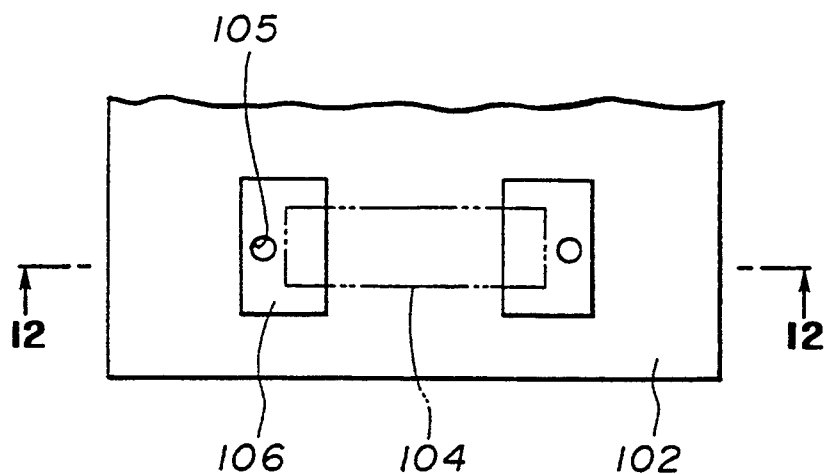

FIG. 11 is a schematic plan view showing another example of a conventional printed circuit board.

Figure 12:
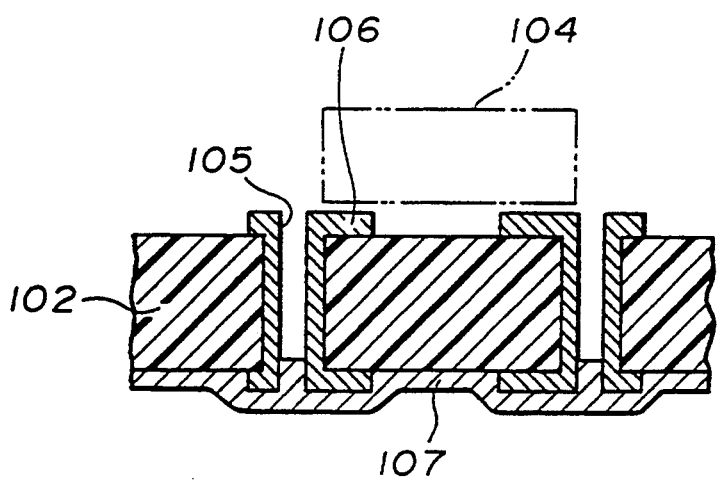

FIG. 12 is a cross-sectional view along line 12—12 of FIG. 11.

DESCRIPTION OF THE PREFERRED EMBODIMENTS

Referring to the drawings, preferred embodiments of the present invention will be explained in detail.

Figure 1:
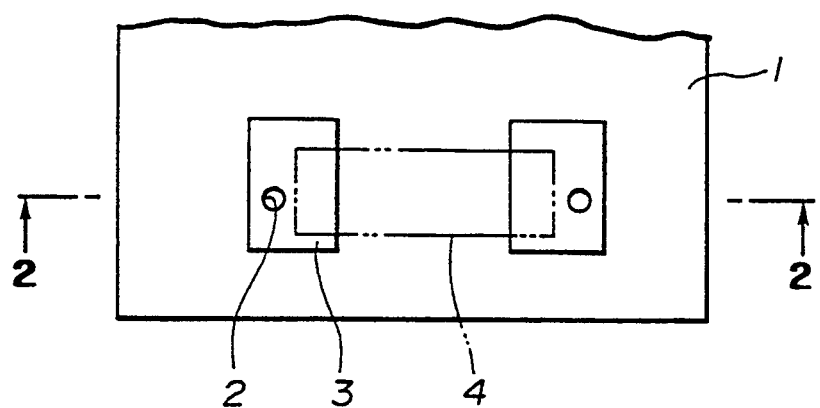
FIG. 1 is a schematic plan view showing an embodiment of a printed circuit board according to the present invention.
Figure 2:
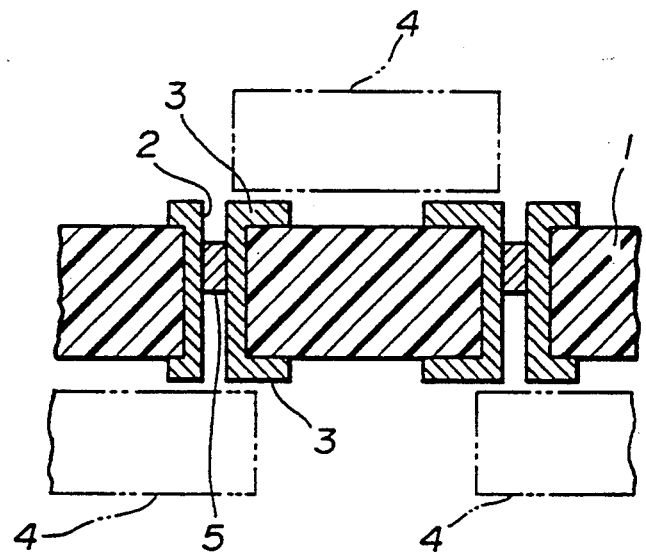
FIG. 2 is a cross-sectional view along line 2—2 of FIG. 1.

With the printed circuit board of the present embodiment, a land 3 is provided at an optional place of a substrate 1, and a through-hole 2 is bored within the land 3, as shown in FIGS. 1 and 2.

The substrate 1 is an electrically insulating plate which is about 0.8 mm thick and which is formed of any material employed with this type of the printed circuit board. For example, the substrate 1 may be a glass-epoxy resin laminated sheet.

A desired interconnection pattern is formed on the surface of the substrate 1, and a solder resist layer, not shown, formed of a photo-curable solder resist is formed depending on the interconnection pattern.

The through-hole 2 is formed in the substrate 1 from its front surface ( one surface ) to its reverse surface ( other surface) and is of a diameter of the order of 0.3 mm. The inner surface of the through-hole 2 is plated with copper or the like electrically conductive material for establishing electrical connection between the land 3 provided on the front, surface of the substrate land the land 3 provided on its reverse surface. A photo-curable solder resist, 5 is charged at, a mid part, of the through-hole 2 simultaneously with the formation of the solder resist, and cured in situ for stopping the through-hole 2.

Meanwhile, the through-hole 2 is provided within the region of the land 3, as mentioned previously, so that the through-hole 2 is positioned within the land 3, that is, it is not spaced apart from the land 3.

Wit,h the printed circuit board, the land 3 is soldered, such as with a cream solder, to plural leads (not shown) provided on both sides of a chip component 4 mounted on the printed circuit board.

Since the photo-curable solder resist 5, which is an electrically insulating resin composition, is charged at a mid part, of the through-hole 2, the solder allowed to flow into the through-hole 2 from the surface of the substrate 1 during the soldering of the leads of the chip component to the land 3 is blocked by the photo-curable resist 5 without reaching the reverse surface of the substrate.

The method for producing the above-described printed circuit board is hereinafter explained.

Figure 3:
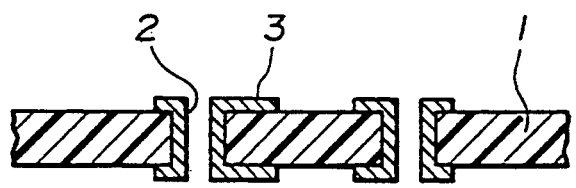
FIG. 3 is a schematic cross-sectional view showing the production process for producing a printed circuit board embodying the present invention, and particularly showing the step of forming a through-hole.

For producing the above-described printed circuit board, the through-hole 2 plated with an electrically conductive metal, such as copper, and the land, is formed in the substrate 1 by patterning, as shown in FIG. 3. At this time, the through-hole 2 is formed within the region of the land 3.

Figure 4:
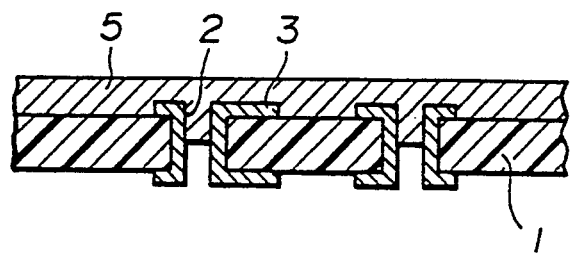
FIG. 4 is a schematic cross-sectional view showing a step of coating a photo-curable solder resist.

The liquid photo-curable solder resist 5, such as one produced by TAIYO INK KK under the trade name of H59K, is applied on the upper surface of the substrate 1 by, for example, screen printing, to a thickness of 15 to 25 $\mu$m, as shown in FIG. 4. The photo-curable solder resist 5 is charged at this time within the through-hole 2.

Hot air at 80° to 90° C. is blown onto the substrate 1 for 20 to 30 minutes semi-curing the liquid photo-curable solder resist 5.

Figure 5:
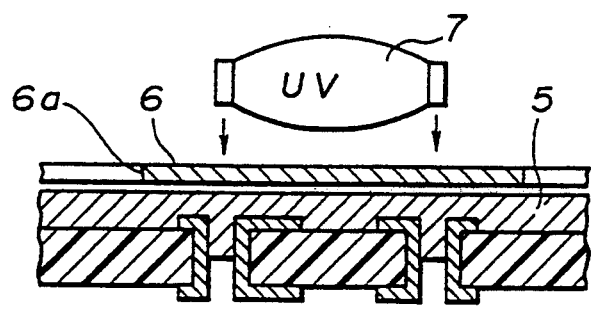
FIG. 5 is a schematic cross-sectional view showing the step of a selective light exposure for forming the solder resist.

A photo-mask 6, having a through-opening 6a formed therein in accordance with a desired resist pattern, is placed at a certain small distance from the front surface of the substrate 1, that 1s above the photo-curable solder resist 5, and a ultra-violet (UV) lamp 7, such as a 5 kW metal halide lamp 7, is placed on the photomask 6, as shown in FIG. 5. The ultra-violet rays of 100 to 1000 mJ/cm$^2$ are radiated from the UV lamp 7 for selectively exposing the portion of the photo-curable solder resist 5 in register with the through-hole 6a.

This causes the port,ion of the semi-cured photo-curable solder resist 5 in register with the through-hole 6a to be cured completely, as a result of which a solder resist layer is formed depending on the interconnection pattern.

Figure 6:
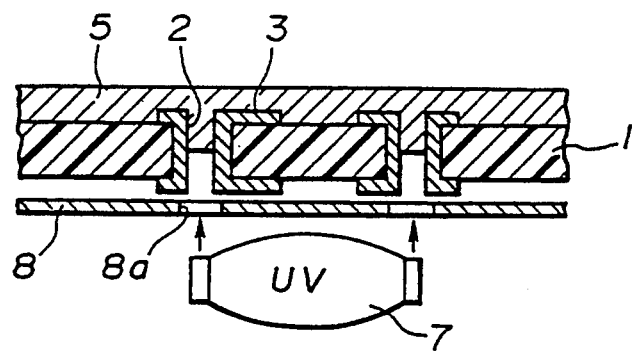
FIG. 6 is a schematic cross-sectional view showing the step of a selective light exposure for the solder resist within the through-hole.

A photomask 8 having a light-transmitting area (through-opening) 8a in register with the through-hole 2 to be stopped with the photo-curable solder resist, 5 is then placed on the reverse surface of the substrate 1, and the UV lamp 7 is placed therebelow, as shown in FIG. 6.

The photo-curable solder resist, 5 in the through-hole 2 is exposed to light, for a predetermined time by radiating UV rays from the UV lamp 7 for curing the solder resist, to a certain extent.

The intensity of the UV rays and/or the exposure time need to be adjusted appropriately for avoiding curing of the photo-curable solder resist, applied on the through-hole 2 due to excess curing.

Although the photomask 8 may be eliminated during the exposure process, it is desirable to provide the photomask 8 for avoiding a phenomenon in which the thin film of the solder resist is formed on a surface portion of the substrate 1 which is not, provided with a copper land and which is not to be provided with the solder resist. Such phenomenon, if produced, proves to be a hindrance to position detection based on the contrast between the copper pattern and the substrate.

Figure 7:
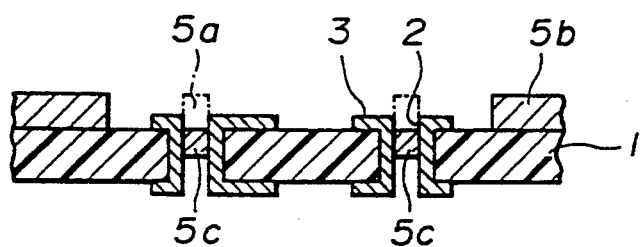

After light exposure from the front and reverse substrate surfaces, the photo-curable solder resist 5, is developed by immersing the substrate 1 in a developing agent, such as a 0.5 to 2% sodium carbonate solution. This causes the semi-cured portion of the photo-curable solder resist 5, that is the portions thereof not irradiated with UV rays by the above-described exposure operations, to be dissolved and removed, so that a solder resist layer 5b having a pattern corresponding to the interconnection pattern and the photo-curable solder resist 5c stopping the through-hole 2 are left on the front substrate surface, as shown in FIG. 7.

After the substrate 1 is turned upside down and a photo-curable solder resist is applied on the reverse surface of the substrate 1, a selective light exposure is carried out from the reverse substrate surface, using a photomask having through-openings in accordance with a desired pattern for producing the printed circuit board having solder resist layers on both substrate surfaces.

Although the present invention has been explained in connection with certain preferred embodiments, the present invention is not limited to these embodiments.

For example, the sequence of the light exposure operation is arbitrary such that the light exposure from the reverse substrate surface may be carried out in advance of the light exposure from the front substrate surface. Alternatively, the light exposure from the front substrate surface and that from the reverse substrate surface may be carried out simultaneously.

Besides, the present invention may be applied to such printed circuit board in which the land 3 on which the chip component is mounted and the through-hole 2, or so-called via-hole, co-exist with the land 9 on which the discrete component is mounted and the through-hole 10, as shown in FIG. 8.

In this case, the through-hole 2 provided in the land 3 on which the chip component is actually mounted serves for electrical connection between the front and reverse substrate surfaces, such that no lead is introduced in the through-hole 2. Consequently, the photo-curable solder resist 5c is charged halfway in the through-hole 2, simultaneously with formation of the solder resist 5b, by using the technique similar to that used in the preceding embodiment.

On the other hand, the through-hole 10 provided in the land 9 on which the discrete component is mounted is not charged with the photo-curable solder resist 5c, but kept open, because leads of the discrete component is introduced into the through-hole 10 and soldered in position.

For charging the photo-curable solder resist 5c selectively only in the through-hole 2 provided in the land 3 on which the chip component is to be mounted and cured, it suffices to perform a light exposure in the step shown in FIG. 6 using a photomask having through-holes in register with the through-holes 2.

That is, it suffices to use such a photomask 11 in which through-openings 11a are formed in register with the through-holes 2 provided in the lands 3 on which the chip components are mounted and in which the region in register with the through-holes 10 formed in the lands 9 on which the discrete components are mounted, is designed as a light blocking region, with the photo-curable solder resist 5 in the through-hole being selectively exposed to light from the reverse surface of the substrate 1, as shown in FIG. 9.

Such embodiment may be implemented by selective light exposure of exposing the reverse substrate surface to light using the photomask.

If, in a printed circuit board on which through-holes 2 provided in the lands 3 on which chip components are mounted coexist with through-holes 10 provided in the lands on which discrete components are mounted, the photo-curable solder resist 5 within the through-holes is exposed to light from the reverse substrate surface without using the photomask, not only the through-holes 2 but also the through-holes 10 are stopped with the photo-curable solder resist 5. If the through-holes 10 are also stopped with the photo-curable resist, it becomes impossible to insert and solder the leads of the discrete components.

In the printed circuit board according to the above-described embodiment, since the through-holes are stopped with the photo-curable solder resist, the solder allowed to flow into the through-hole during soldering of leads of the chip components to the lands of the printed circuit board is blocked by the photo-curable solder resist to prevent inadvertent shorting. Besides, since there is no fear of the lands on the reverse side of the substrate being covered by the photo-curable solder resist, a high packaging density of the chip components may also be assured.

Thus the printed circuit board is provided which is highly reliable and permits of high density packaging.

Besides, the photo-curable solder resist stopping the through-holes is formed simultaneously with the solder resist layer on the front surface of the substrate to facilitate the production. Besides, since the solder resist can be formed only in the through-holes of the packaged parts of the chip components by selective light exposure, the present invention may be applied to a printed circuit board on which discrete components which need to be soldered with leads introduced into the through-holes co-exist with chip components.

The method for producing the printed circuit board according to the present invention is advantageous for production because the photo-curable solder resist can be formed in the through-hole by simply annexing a step of selective light exposure from the reverse substrate surface to the customary production process of forming the solder resist layer.

What is claimed is:
1. A printed circuit board, comprising:
   a substrate having a front side and a reverse side; and
   a land provided on said substrate, said land having a through-hole extending from said front side of the substrate to said reverse side thereof;
   characterized in that a solder resist layer of a photo-curable solder resist is formed in accordance with an interconnection pattern on the front side of the substrate, at least a mid part of the through-hole is stopped with a photo-curable solder resist which is of the same material as that of the solder resist layer, and a portion of the land adjacent the through-hole is free of solder resist to enable soldering of said land on both sides of said substrate.

2. The printed circuit board as claimed in claim 1 wherein said land provided on said substrate comprises a plurality of lands with through-holes formed therein, a mid part of at least one of the through-holes being stopped with the photo-curable solder resist, and at least one of the through-holes being free of said photo-curable solder resist and remaining opened.

3. A printed circuit board, comprising:
   a substrate having a front side and a reverse side; and
   a land formed of an electrically conducting material provided on said substrate, said land having a first soldering surface on said front side of said substrate, a second soldering surface on said reverse side of said substrate, and a through-hole extending from said first surface to said second surface;

wherein a solder resist layer of a photo-curable solder resist material is formed on at least one side of the substrate, at least a mid part of the through-hole is stopped with a photo-curable solder resist material, and said first and second soldering surfaces are free of solder resist material to enable soldering to said land on both sides of said substrate.

4. The printed circuit board as set forth in claim 3, wherein said solder resist material of said solder resist layer is the same as said solder resist material within said through-hole.

5. The printed circuit board as set forth in claim 4, wherein said solder resist material of said solder resist layer and said solder resist material within said through-hole are cured by ultraviolet rays to resist dissolving by a developing agent.

* * * * *